(12) United States Patent
Ognibene et al.

(10) Patent No.: US 6,273,186 B1
(45) Date of Patent: Aug. 14, 2001

(54) LOW-COST, HIGH DENSITY, STAGGERED PIN FIN ARRAY

(75) Inventors: Edward J. Ognibene, Belmont; Evgeny N. Holmansky, Acton; Douglas L. Johnson, Georgetown, all of MA (US)

(73) Assignee: SatCon Technology Corporation, Cambridge, MA (US)

(*) Notice: Subject to any disclaimer, the term of this patent is extended or adjusted under 35 U.S.C. 154(b) by 0 days.

(21) Appl. No.: 09/524,317

(22) Filed: Mar. 13, 2000

(51) Int. Cl.$^7$ ...................................................... H05K 7/20
(52) U.S. Cl. .................. 165/185; 165/80.3; 174/16.3; 257/722; 361/704; 29/890.03
(58) Field of Search .................. 165/80.3, 185; 174/16.3; 257/722; 361/690, 703, 704; 29/890.03

(56) References Cited

U.S. PATENT DOCUMENTS

| | | |
|---|---|---|
| 3,404,446 | 10/1968 | Kritzer . |
| 5,369,301 | 11/1994 | Hayashi et al. ........................ 257/722 |
| 5,381,859 | 1/1995 | Minakami et al. .................. 165/80.3 |
| 5,419,041 | 5/1995 | Ozeki .................. 29/890.03 |
| 5,421,406 | 6/1995 | Furusawa et al. .................... 165/185 |
| 5,447,189 * | 9/1995 | McIntyre ............................. 165/185 |
| 5,930,115 | 7/1999 | Tracy et al. . |

FOREIGN PATENT DOCUMENTS

| | | |
|---|---|---|
| 1 026 013 | 2/1978 | (CA) . |
| 25 31 450 | 1/1977 | (DE) . |
| 1 334 173 | 6/1971 | (GB) . |
| 2 270 862 | 3/1994 | (GB) . |
| 4-234153 | 8/1992 | (JP) . |
| 6-74675 * | 3/1994 | (JP) ..................................... 165/185 |

OTHER PUBLICATIONS

Biskeborn R.G., et al., "Cooling Fin Structure"; IBM Technical Disclosure Bulletin; vol. 25, No. 2, p. 618, Jul. 1982.

* cited by examiner

Primary Examiner—Leonard Leo
(74) Attorney, Agent, or Firm—Dike Bronstein Roberts & Cushman IP Group; George W. Hartnell, III; Edwards & Angell LLP

(57) ABSTRACT

A high-density, staggered pin fin array, and a method for manufacturing the pin fin array, are disclosed. The pin fin array includes a plurality of fin members, each having a plurality of elongated, pin-shaped fins arranged in a row; and, at least one connector for connecting the fins together, each at one end thereof. The plurality of fin members is arranged in a stack, wherein respective fins of each fin member are in registration with slots formed in its adjacent fin members in the stack. The method for manufacturing the pin fin array includes forming a plurality of fin members from a raw planar, tape, or thin layer stock, positioning the fin members relative to each other so that the respective fins of each fin member are in registration with the slots formed in adjacent fin members, and joining each fin member with the adjacent fin members. The high-density, staggered pin fin array produces very high heat transfer coefficients by geometrically inducing turbulent mixing, thereby increasing the thermal performance of the pin fin array.

16 Claims, 3 Drawing Sheets

LOW-COST, HIGH DENSITY, STAGGERED PIN FIN ARRAY

BACKGROUND OF THE INVENTION

1. Field of the Invention

This invention relates generally to apparatuses for providing convective heat transport; and, more particularly to apparatuses such as heat sinks, cold plates, and heat exchangers including arrays of pin-shaped fins for use in removing heat generated in, e.g., electronic systems and components, and methods of manufacturing such pin fin arrays.

2. Background

Traditionally, apparatuses such as heat sinks, cold plates, and heat exchangers including plate-shaped fins have been used for removing or transferring heat generated in, e.g., electronic components and systems during operation. More recently, heat sinks, cold plates, and/or heat exchangers with arrays of elongated, pin-shaped fins (also known as "pin fin arrays") have been used for similar purposes.

Many different types, geometries, and styles of fins included in pin fin arrays have been contrived including, e.g., circular and rectangular cylinders, conical protrusions, serrated extrusions, and fluted cylinders. The term, pin (as used in "pin fin array"), is a vestige from early designs in which wire pins were used to create the array, and is generally used in contemporary pin fin array designs to refer to any fin configuration, some of which are mentioned above. Further, the phrase, pin fin array, is generally used to refer to any cold plate, heat sink, or heat exchange surface that uses an array of structures (of a variety of geometries and/or configurations) for inducing turbulence and increasing wetted surface area for the purpose of enhancing heat transfer from (or to) the array to (or from) a fluid medium by convective heat transport.

Pin fin arrays have advantages over plate-shaped fins in that they typically provide a larger surface area over which the generated heat can be absorbed or dissipated, and are generally better suited for applications in which coolant flow characteristics are unknown or variable in magnitude and/or direction. Such pin fin arrays have therefore been used for significantly improving heat transfer and thermal control in, e.g., highly integrated and/or power dense electronic components and systems.

One example of heat sinks having pin-shaped fins, including a process for producing the heat sinks, is disclosed in U.S. Pat. No. 5,421,406 ("the '406 patent") issued Jun. 6, 1995, to Furusawa et al. In accordance with that disclosure, such heat sinks include a heat dissipating base plate, and a plurality of comb-like fin members arranged in parallel at a predetermined spacing on one surface of the base plate approximately perpendicular thereto. Each of the fin members include pin-shaped fins arranged in a row and a connector that connects the fins together each at one end thereof, the connector of each fin member being joined to the surface of the base plate. The fins are given a greater height and arranged with a reduced pitch with a higher density for disposal of increased amounts of heat. To prepare the heat sink, the fin members are blanked out from a metal sheet; the fin members and spacer plates are arranged alternately on one surface of a heat dissipating base plate approximately perpendicular thereto; the connectors of the fin members are joined to the base plate; and, the spacer plates are thereafter removed. A comb-like fin member having pin-shaped fins and a large length is bent to a zigzag form when seen from above.

However, the heat sinks described in the '406 patent have some drawbacks. For example, the plurality of comb-like fin members is arranged on the surface of the base plate in such a way that the fins of each fin member are in-line with the fins of adjacent fin members. Such an arrangement of fin members often results in heat sinks with less-than-optimal heat transfer characteristics. Further, the process for manufacturing the heat sinks includes the steps of alternately arranging the fin members and the spacer plates on the surface of the base plate, joining the connectors of the fin members to the base plate, and then removing the spacer plates. However, such use of spacer plates in the production of heat sinks with pin-shaped fins frequently leads to complicated manufacturing processes that can significantly increase the cost of the heat sinks.

Another example of heat sinks with pluralities of fin segments is disclosed in CA Patent 1,026,013 ("the '013 patent") issued Feb. 7, 1978, to Elgar et al. In accordance with that disclosure, a heat sink for a semiconductor cell includes a predetermined length cut from an aluminum extrusion. The length of the extrusion has a body portion adapted for heat conducting contact with the semiconductor and a number of fins projecting from the body portion in spaced relation, defining fluid flow passages between fins. Further, a device for transferring heat from the sink to the fluid includes slits across some or all of the fins, thereby dividing these fins into fin segments. At least some of the fin segments are offset into adjacent flow passages for increasing turbulence of fluid flow and fin surface, thereby increasing heat transfer from the sink to the fluid.

Although the heat sinks described in the '013 patent have improved heat transfer characteristics, these heat sinks also have some drawbacks. For example, the process for manufacturing the heat sinks includes the step of forming a heat sink with fin segments from an aluminum extrusion. However, in order to produce heat sinks with high fin segment densities from such extrusions, it is often necessary for the heat sinks to undergo a post-machining process, which can also significantly increase the cost of the heat sinks.

Other processes for manufacturing pin fin arrays include mold casting; and, cold, warm, or hot forging. However, pin fin arrays produced using mold casting must also generally undergo post-machining processes, which typically increase costs. Similarly, processes for manufacturing pin fin arrays by forging are frequently expensive. Moreover, pin fin arrays produced using these manufacturing processes often do not have the densities and/or configurations required for optimally controlling heat transfer in today's highly integrated and/or power dense electronic components and systems.

It would therefore be desirable to have an improved pin fin array for providing optimal thermal control in highly integrated and/or power dense electronic components and systems. Such pin fin arrays would have fin densities and configurations for improving heat transfer from the pin fin arrays to a coolant. It would also be desirable to have a process for manufacturing such pin fin arrays that is both simple and low-cost. Such a manufacturing process would also provide increased flexibility, thereby allowing the design and optimization of pin fin arrays suitable for use with a wide range of systems and components having a wide range of performance requirements.

SUMMARY OF THE INVENTION

The present invention provides a high-density pin fin array with a fin configuration marked by an alternating or staggered pattern, for providing optimal heat transfer and thermal control in highly integrated and/or power dense electronic components and systems. The present invention also provides a simplified, flexible process for manufacturing the pin fin arrays that is not only relatively inexpensive to implement, but can also be used to design and optimize pin fin arrays suitable for use with a wide range of systems and components having a wide range of performance requirements.

According to one embodiment of the present invention, a pin fin array includes a plurality of fin members, each fin member including a plurality of pin-shaped fins arranged in a row, and at least one connector for connecting the fins together, wherein the plurality of fins of each fin member are arranged in the row at a predetermined spacing, thereby forming a plurality of slots therebetween, and wherein the plurality of fin members are stacked, thereby causing respective fins of each fin member to be in registration with the slots of adjacent fin members in the stack.

According to one feature of the present invention, respective fins of successive pairs of adjacent fin members are offset into adjacent slots formed in the adjacent fin members, thereby enhancing heat transfer through turbulent mixing of a coolant.

The above-described embodiment of the high-density, staggered pin fin array significantly improves heat transfer via convection from the pin fin array to the coolant flowing over and through the pin fin array.

According to another embodiment of the present invention, a method of manufacturing a high-density, staggered pin fin array includes the steps of stamping-out a plurality of fin members from metal sheet stock; positioning the plurality of fin members relative to each other so that each fin member or group of fin members is a reverse mirror image of its adjacent fin members or groups of fin members; and, joining each fin member with its adjacent fin members, thereby forming the pin fin array.

According to still another embodiment of the present invention, a method of manufacturing a high-density, staggered pin fin array includes the steps of interdigitating respective fins of successive pairs of adjacent fin members; and, end-milling to create an open-sided array for, e.g., impingement designs.

The above-described embodiments of the method of manufacturing a high-density, staggered pin fin array are relatively simple and inexpensive to implement, thereby allowing the manufacture of relatively low-cost pin fin arrays for accommodating a wide range of designs and performance requirements.

Still further aspects and advantages will become apparent from a consideration of the ensuing description and drawings.

BRIEF DESCRIPTION OF THE DRAWINGS

The invention will be better understood by reference to the following more detailed description and accompanying drawings in which.

DETAILED DESCRIPTION OF THE INVENTION

Figure 1:
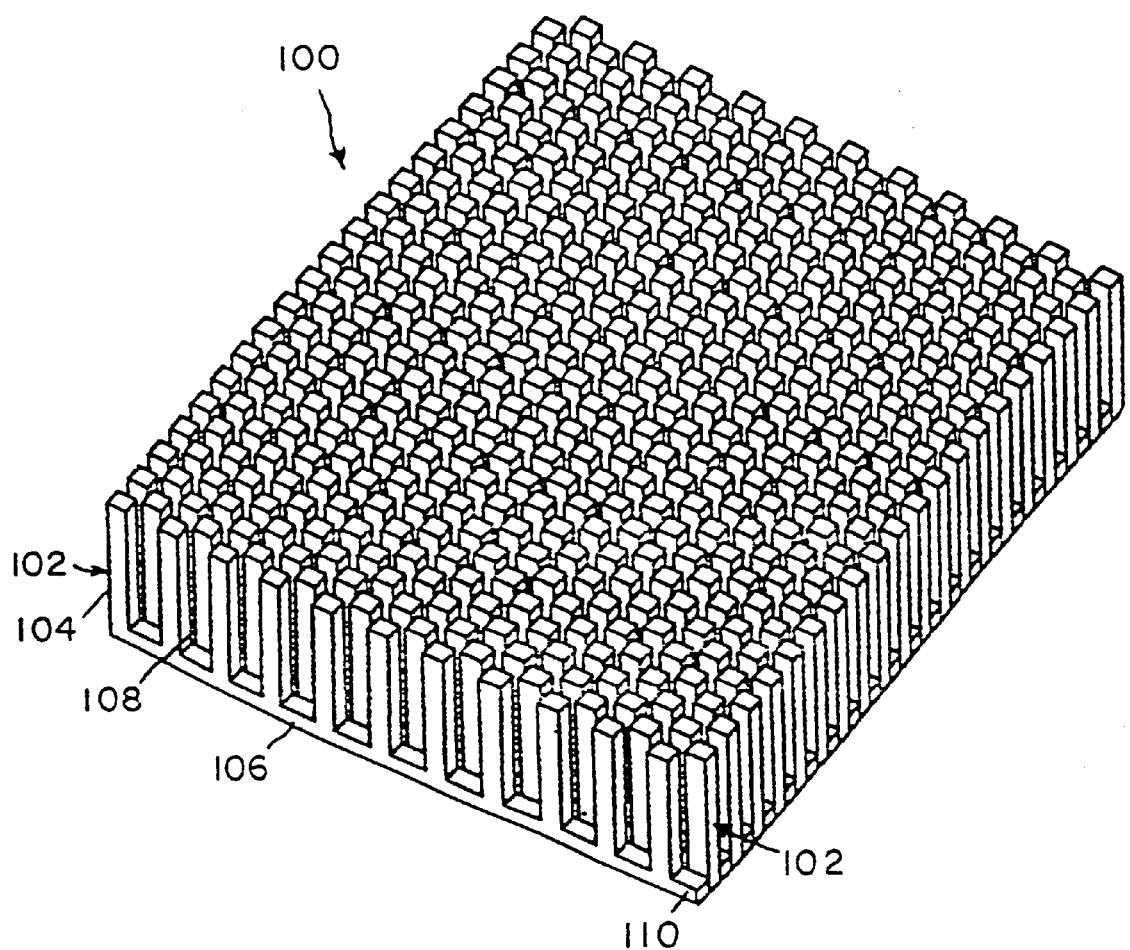
FIG. 1 is a perspective view of a pin fin array in accordance with the present invention.

FIG. 1 shows a perspective view of an illustrative embodiment of a pin fin array 100 in accordance with the present invention. The pin fin array 100 includes a plurality of fin members 102. Further, each fin member 102 includes a plurality of elongated, pin-shaped fins 104 arranged in a row; and, a connector 106, which connects the fins 104 together, each at one end thereof.

Specifically, each fin 104 has a generally square or rectangular cross-section. Further, the plurality of fins 104 are preferably arranged in a row along the connector 106 at regularly spaced intervals, thereby defining a plurality of slots 108. In addition, the connector 106 of each fin member 102 includes a projecting portion 110 at one end of the fin member 102, having a length approximately equal to the width of each slot 108.

Adjacent fin members 102 of the pin fin array 100 are joined at face portions (not numbered) of respective connectors 106 in any suitable manner. For example, the adjacent fin members 102 may be joined at the face portions of the respective connectors 106 either with a suitable adhesive or by soldering, brazing, pinning, or riveting. Alternatively, the adjacent fin members 102 may be joined to a common base plate (not shown) in a similar manner. Specifically, adjacent pairs (not numbered) of the fin members 102 of the pin fin array 100 are joined such that respective projecting portions 110 of the adjacent pairs are at opposing sides (not numbered) of the pin fin array 100.

As a result, the adjacent pairs of the fin members 102 are superimposed, whereby a fin 104 at one end (not numbered) of a first fin member 102 is in-line with a projecting portion 110 of a second fin member 102, and remaining fins 104 of the first fin member 102 are in registration with slots 108 of the second fin member 102. In effect, respective fins 104 of the adjacent fin members 102 are staggered; i.e., the respective fins 104 of the adjacent fin members 102 form an alternating pattern. An important advantage of the illustrative embodiment of FIG. 1 is that the staggered fins 104 of the pin fin array 100 improve heat transfer via forced convection, specifically, geometrically induced turbulent mixing, from the pin fin array 100 to a coolant flowing over and through the pin fin array 100. For example, the coolant flow may be provided as a forced flow or natural convection of any fluid such as air, gas, vapor, liquid, or any mixture thereof.

A detailed description of a preferred method of manufacturing such a high-density, pin fin array with staggered fins is provided later in this specification.

The pin fin array 100 is normally thermally engaged with one or more electronic components (not shown) of an electronic system (not shown) in any conventional manner. It should therefore be understood that the manner in which the pin fin array 100 engages an electronic component(s) and/or system is not critical to the invention, and may be accomplished in different ways.

In the illustrative embodiment, once the pin fin array 100 is suitably thermally engaged with the electronic component (s) and/or system, heat generated in the electronic component(s) and/or system during operation is first transferred to the pin fin array 100 via conduction, and then transferred to a coolant via forced convection. Accordingly, in this illustrative embodiment, the manner in which the pin fin array 100 thermally engages the electronic component(s) and/or system preferably optimizes the conductive transfer of heat from the electronic components) and/or system to the pin fin array 100. Further, the increased flexibility of the manufacturing process of the present invention allows the design and optimization of pin fin arrays that can satisfy the specific performance requirements of this illustrative embodiment.

Figure 3A:
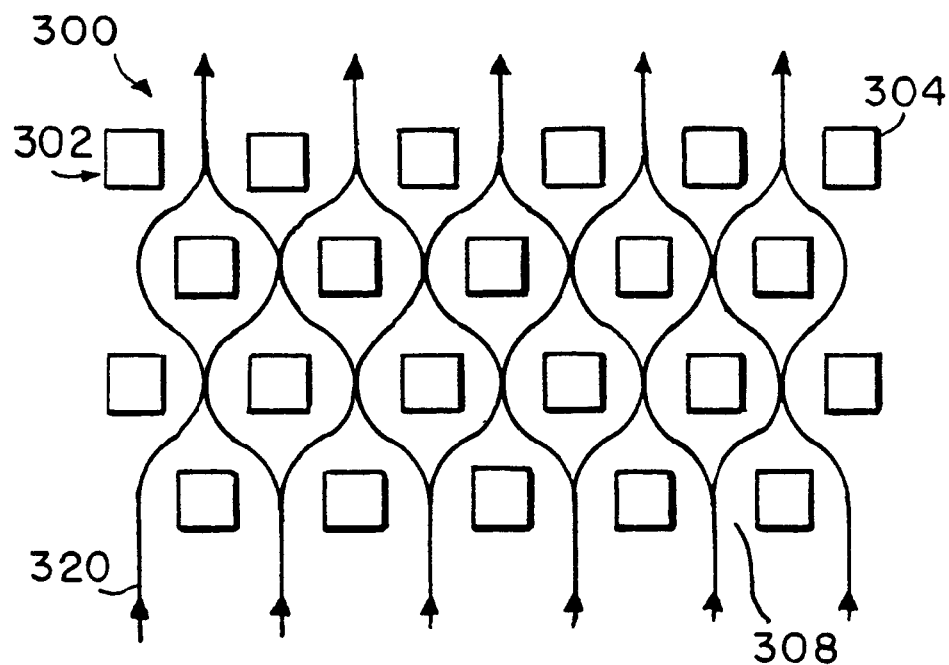
FIGS. 3A and 3B are partial top plan views of the pin fin array of FIG. 1, showing orthogonal primary and secondary coolant flow directions.

Moreover, the staggered fins 104 of the pin fin array 100 improve the transfer of heat via forced convection from the pin fin array 100 to the coolant by increasing geometrically induced turbulent mixing and boundary layer redevelopment in the coolant flow. For example, FIG. 3A shows a partial top plan view of a pin fin array 300, including a plurality of fin members 302, each with pin-shaped fins 304 arranged in a row, and slots 308 between adjacent fins 304. Further, respective fins 304 of adjacent rows are staggered, with the fins 304 in each row being in registration with respective slots 308 in the adjacent rows.

FIG. 3A also shows a primary coolant flow direction 320. Because the respective fins 304 of the adjacent rows are staggered, the fins 304 that are in registration with the respective slots 308 interrupt uniform coolant flow in the primary direction 320, thereby causing the coolant to follow the circuitous flow direction 320, as shown in FIG. 3A. As a result, the coolant develops a larger heat transfer coefficient. As mentioned above, this generally increases turbulence and boundary layer redevelopment in the coolant flow, thereby enhancing heat transfer via convection from the pin fin array 300 to the coolant.

Figure 3B:
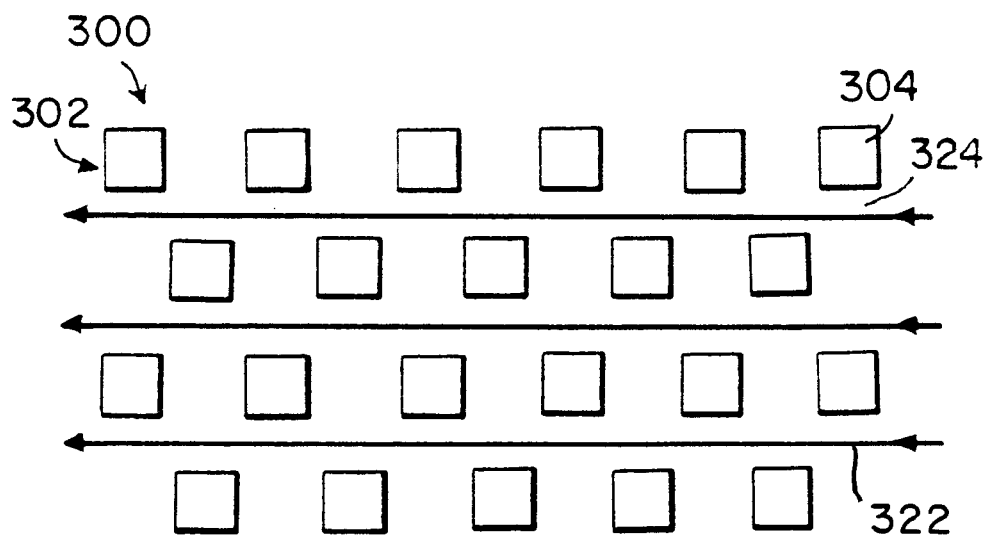

It should be understood that the thermal performance of the pin fin array 300 typically varies in accordance with the coolant flow direction. For example, FIG. 3B shows another partial top plan view of the pin fin array 300. However, instead of showing the primary coolant flow direction 320, FIG. 3B shows a secondary coolant flow direction 322, which is approximately orthogonal to the primary coolant flow direction 320. Because the secondary coolant flow direction 322 and the fin members 302 are approximately parallel, there is generally less geometrically induced turbulent mixing of the coolant flowing in spaces 324 between adjacent fin members 302. As a result, the coolant flowing in the secondary coolant flow direction 322 typically develops a smaller heat transfer coefficient than the coolant flowing in the primary coolant flow direction 320, thereby generating correspondingly less turbulence and boundary layer redevelopment in the coolant flow and diminishing the thermal performance of the pin fin array 300.

This means that in, e.g., an electronic system (not shown) incorporating one or more of the pin fin arrays 300, a coolant flow can be directed at an angle corresponding with the primary coolant flow direction 320, an angle corresponding with the secondary coolant flow direction 322, or any angle therebetween, thereby determining the level of turbulence in the coolant flow and therefore the level of thermal performance and the desired pressure drop of the pin fin array 300.

For example, if the coolant flow is directed at the angle corresponding with the primary coolant flow direction 320, then the level of turbulence and the associated heat transfer coefficient are maximized, thereby enhancing the thermal performance of the pin fin array 300. Alternatively, if the coolant flow is directed at the angle corresponding with the secondary coolant flow direction 322, then the level of turbulence and the associated heat transfer coefficient are minimized, thereby diminishing not only the thermal performance of the pin fin array 300 but also the pressure drop, which can be a determining factor in both the design and performance of the pin fin array 300. Further, if the coolant flow is directed at any angle therebetween (not shown), then some mid-level of thermal performance of the pin fin array 300 can be achieved.

An important advantage of the illustrative embodiment of FIGS. 3A and 3B is that the pin fin array 300 is particularly suitable for use in, e.g., electronic systems, wherein the coolant flow direction is unknown or variable in magnitude and/or direction, which may occur whether the coolant is buoyancy-driven, i.e., unforced, or forced over the pin fin array 300; and, in impingement designs wherein the coolant impinges on the fin members 302 of the pin fin array 300 in a direction orthogonal to the connectors 106 (see FIG. 1) and then flows radially between the fin members 302 in parallel with the plane of the connectors 106. This is because it is expected that useful levels of thermal performance of the pin fin array 300 will be achieved when the coolant flow is directed at any angular orientation between the primary and secondary coolant flow directions 320 and 322. For example, it is expected that such useful levels of thermal performance of the pin fin array 300 will be achieved in electronic systems wherein the coolant impinges upon the pin fin array 300, and then flows over the pin fin array 300 in all radial directions.

The preferred method of manufacturing the high-density, staggered pin fin array of the present invention will now be described with reference to FIGS. 2 and 4. As mentioned above, the pin fin array of the present invention includes a plurality of fin members. Accordingly, in the preferred method of manufacturing the pin fin array, each fin member is first stamped-out from, e.g., metal sheet stock.

Figure 2:
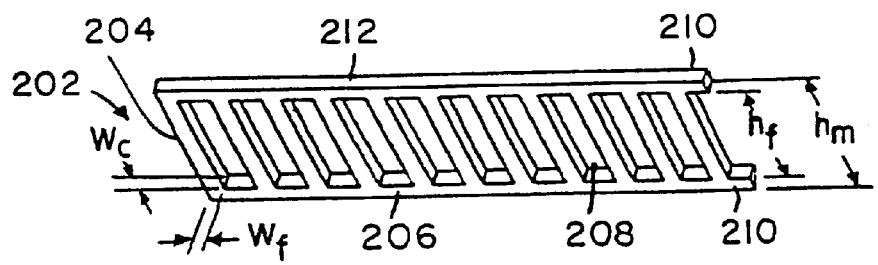
FIG. 2 is a perspective view of a fin member in accordance with the present invention.

For example, FIG. 2 shows another illustrative embodiment of a fin member 202 stamped-out from metal sheet stock, e.g., aluminum sheet stock. Specifically, the fin member 202 includes a plurality of elongated, pin-shaped fins 204 arranged in a row along connectors 206 and 212 at regularly spaced intervals, thereby defining a plurality of slots 208. In addition, the connectors 206 and 212 each include a projecting portion 210 at one end of the fin member 202, having a length approximately equal to the width of each slot 208.

It should be pointed out that in this illustrative embodiment of the fin member 202, a pair of connectors 206 and 212 connects the fins 204 together, each at opposing ends thereof, for closing in opposing sides (not shown) of a pin fin array (not shown) including a plurality of the fin members 202. This configuration is particularly useful when the pin fin array is thermally engaged with one or more components on either or both of the closed-in opposing sides.

In contrast, the illustrative embodiment of the fin member 102, as shown in FIG. 1, includes the single connector 106 for connecting the fins 104 together, thereby closing in only one side (not numbered) of the pin fin array 100. This configuration is particularly useful when the pin fin array 100 is thermally engaged with one or more components on only the closed-in side. Accordingly, it should be understood that there is a plurality of different useful embodiments for the fin members of the pin fin array of the present invention, each being dictated by specific performance requirements of the target system; and, the fin members may therefore take different forms.

Any suitable stock may be used for forming the plurality of fin members 202. For example, the raw stock may be any sheet, roll, or layered material such as metal, polymer, ceramic, plastic, resin, or any other suitable material or composite. In one non-limiting representative configuration, the sheet stock may be a coiled sheet of aluminum alloy (not shown) having a thickness equal to about 0.5 mm and a width equal to about 25.0 mm. Accordingly, the fin member 202 stamped out of this illustrative metal sheet stock may have a height, $h_m$, equal to about 25.0 mm, and a thickness, t, equal to about 0.5 mm. Further, each connector 206 and 212 may have a width, $w_c$, equal to about 2.5 mm; and, each fin 204 may have a height, $h_f$, equal to about 20 mm, and a width, $w_f$, equal to about 0.5 mm. It follows that each fin 204 may have an approximately square cross-section (not shown), which is about 0.5 mm in the length of each side. It should be understood, however, that actual materials and dimensions used in forming the plurality of fin members 202 would vary depending upon, e.g., specific properties of the coolant, specific cost and performance requirements of the target system, and raw stock availability.

As mentioned above, adjacent fin members of the pin fin array of the present invention are joined such that respective projecting portions of the adjacent fin members are at opposing sides of the pin fin array. Accordingly, subsequent steps of the preferred method of manufacturing the pin fin array include obtaining a plurality of stamped fin members; and, positioning the fin members relative to each other so that each fin member is a reverse mirror image of its adjacent fin member(s).

Figure 4:
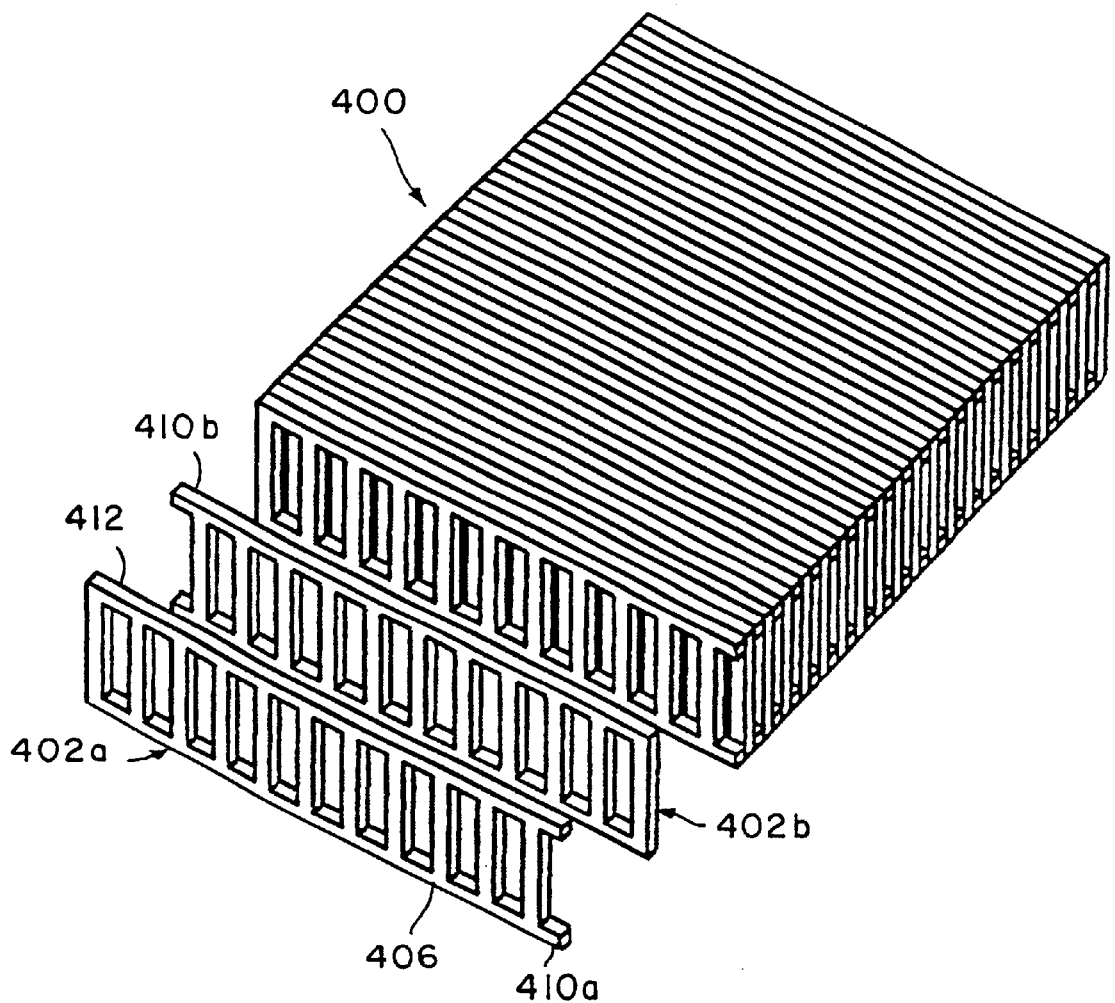
FIG. 4 is a partially exploded, perspective view of another embodiment of a pin fin array in accordance with the present invention.

This is depicted in FIG. 4, which shows fin members 402a and 402b positioned relative to each other so that the fin member 402a is a reverse mirror image of the fin member 402b, and vice versa. As a result, projecting members 410a and 410b of the fin members 402a and 402b, respectively, are at opposing sides of a pin fin array 400.

Each stamped fin member is then joined with its adjacent fin member(s). As mentioned above, adjacent fin members of the pin fin array are joined at face portions of respective connectors in any suitable manner. Accordingly, the adjacent fin members 402a and 402b, and remaining fin members (not numbered) of the pin fin array 400, are joined at face portions (not numbered) of respective connectors 406 and 412. The specific manner in which the adjacent fin members are joined is not critical to the present invention, so long as the resulting pin fin array has sufficient structural integrity for the target application. Alternatively, the fin members 402a and 402b and the remaining fin members of the pin fin array 400 may be suitably joined to a common base plate (not shown).

As a result, the adjacent fin members are superimposed such that a fin at one end of each fin member is in-line with a projecting portion(s) of its adjacent fin member(s), and remaining fins of each fin member are in registration with slots of its adjacent fin member(s). In effect, the fins of the adjacent fin members are staggered, i.e., the fins form an alternating pattern, for increasing turbulence and boundary layer redevelopment, thereby enhancing the transfer of heat via convection from the pin fin array to a coolant flowing over and through the pin fin array.

It is expected that the preferred method of manufacturing pin fin arrays, including the steps of stamping-out a plurality of fin members from raw stock, positioning the stamped fin members relative to each other so that each fin member is a reverse mirror image of its adjacent fin member(s), and joining each positioned fin member with its adjacent fin member(s), will produce staggered, pin fin arrays of extremely high density. For example, it is expected that this preferred manufacturing method would produce relatively large pin fin arrays having fins with widths as small as 0.4 mm or less and one-to-one spacing, depending upon the particular stamping or cutting process. Significantly, it is expected that such high-density, staggered, pin fin arrays would be produced with little or no machining, thereby enabling relatively high volume production of the pin fin arrays at substantially reduced costs.

Having described the preferred embodiment and several illustrative embodiments of the present invention, numerous alternative embodiments or variations might be made. For example, particular raw stock material and particular dimensions of the fin members of the pin fin array were described. However, these were merely illustrative examples, and, as mentioned above, other useful materials and/or dimensions are possible, depending upon the specific cost and performance requirements of the target system and/or component. It should be noted, however, that the present invention including the high-density, staggered pin fin array is especially beneficial when configured for maximizing turbulent coolant flow, thereby enhancing heat transfer via, e.g., forced convection from the pin fin array to the coolant.

In addition, it was described that the respective fins of the adjacent fin members of the pin fin array are staggered, i.e., the respective fins of the adjacent fin members form an alternating pattern, for increasing turbulent flow and boundary layer redevelopment in the primary coolant flow direction. However, this was also merely an illustrative example. Respective fins of successive pairs of adjacent fin members might also be offset into adjacent slots formed in the adjacent fin members, thereby interdigitating the respective fins of the successive pairs of adjacent fin members, for increasing turbulent flow and boundary layer redevelopment in the secondary coolant flow direction. It is expected that higher levels of thermal performance would be achieved with this alternative embodiment of the present invention, especially in the impingement designs as described above.

In addition, it was described that each fin member of the pin fin array may include a single connector for connecting fins, each at one end thereof; or, each fin member of the pin fin array may include a pair of connectors for connecting the fins, each at opposing ends thereof. However, these were merely illustrative examples, and alternative embodiments of the fin members are possible. For example, one alternative embodiment of each fin member may include a connector for connecting the fins, each at an intermediate position between the opposing ends thereof.

In addition, it was described that in the preferred method of manufacturing the pin fin array of the present invention, a plurality of fin members are positioned relative to each other so that each fin member is a reverse mirror image of its adjacent fin members, and then each fin member is joined with its adjacent fin members, thereby forming the pin fin array. However, this was also merely an illustrative example. Groups of fin members might alternatively be positioned in the same orientation and joined; and, successive groups of fin members might be positioned relative to each other so that each group is a reverse mirror image of its adjacent groups, and these adjacent groups of fin members might then be joined, thereby forming an alternative pin fin array configuration.

In addition, it was described that in the preferred method of manufacturing the pin fin array, each fin member is stamped-out from raw stock. However, this was merely an illustrative embodiment. The fin members might alternatively be formed using other suitable processes such as cutting; EDM-ing; etching; and, extruding and cutting/slicing.

In addition, it was described that the pin fin array is normally thermally engaged with one or more components of an electronic system, on either or both sides of the pin fin array, in any conventional manner. However, it should be pointed out that in applications wherein optimal thermal engagement is critically dependent upon surface flatness, the surface of the pin fin array that thermally engages the electronic component might be end-milled, sanded, or ground down to a desired level of flatness. Because the step of end-milling/sanding/grinding a surface is generally relatively low-cost, the addition of this step in the preferred method of manufacturing the pin fin array is not expected to substantially increase the overall cost of the pin fin array.

The present invention has been described in detail including the preferred embodiments thereof. However, it should be appreciated that those skilled in the art, upon consideration of the present disclosure, may make modifications and/or improvements on this invention and still be within the scope and spirit of this invention as set forth in the following claims.

What is claimed is:

1. A high-density, staggered pin fin array, comprising:
   a plurality of identical fin members, each fin member including a plurality of pin-shaped fins arranged in a row, and
   at least one connector for connecting the fins together,
   wherein the plurality of fins of each fin member is arranged in the row at a predetermined spacing, thereby forming a plurality of slots therebetween, and
   wherein the plurality of identical fin members is stacked so that at least one pair of adjacent fin members are reverse mirror images of each other, thereby causing respective fins of one fin member to be in registration with the slots of an adjacent fin member in the stack.

2. The high-density, staggered pin fin array, as recited in claim 1,
   wherein the connector has a projecting portion at one end of the fin member, the projecting portion having a length approximately equal to the predetermined spacing.

3. The high-density, staggered pin fin array, as recited in claim 1,
   wherein the connector of each fin member has a pair of opposing face portions, and the adjacent fin members in the stack are joined at the connector face portions.

4. The high-density, staggered pin fin array, as recited in claim 2,
   wherein respective positions of the connector projecting portions of successive fin members in the stack alternate between opposing ends of the pin fin array.

5. The high-density, staggered pin fin array, as recited in claim 1,
   wherein the plurality of fin members is stacked in a plurality of groups,
      respective fins of each fin member in each group being in registration with the fins of adjacent fin members in each group, and
   wherein the plurality of groups of fin members is stacked, thereby causing
      respective fins of each fin member in one group to be in registration with the slots of at least one adjacent group in the stack.

6. A method of manufacturing the pin fin array of claim 1, comprising the steps of:
   (a) forming a plurality of fin members;
   (b) positioning the plurality of fin members relative to each other so that respective fins of each fin member are in registration with slots formed in adjacent fin members; and
   (c) joining each fin member with its adjacent fin members, thereby forming the pin fin array.

7. The method of manufacturing, as recited in claim 6,
   wherein the plurality of fin members is positioned relative to each other in step (b) for causing at least one pair of adjacent fin members to be
   reverse mirror images of each other.

8. The method of manufacturing, as recited in claim 6,
   wherein the connector of each fin member has at least one pair of opposing face portions, and the fin members are joined in step (c) at the connector face portions.

9. The method of manufacturing, as recited in claim 8, further including the step of
   optionally smoothing a surface of the joined connector portions of the plurality of fin members.

10. The method of manufacturing, as recited in claim 9,
    wherein the surface of the joined connector portions is optionally smoothed using a method selected from the group consisting of end-milling, sanding, and grinding.

11. The method of manufacturing, as recited in claim 8,
    wherein the fin members are joined in step (c) using a method selected from the group consisting of gluing, soldering, brazing, pinning, epoxying, crimping, swaging, and riveting.

12. The method of manufacturing, as recited in claim 6, further including the step of
    interdigitating respective fins of successive pairs of adjacent fin members.

13. The method of manufacturing, as recited in claim 6,
    wherein the plurality of fin members are formed in step (a) using a method selected from the group consisting of stamping, cutting, EDM-ing, etching, and extruding and cutting or slicing.

14. The method of manufacturing, as recited in claim 6,
    wherein the positioning in step (b) includes the substeps of positioning a first plurality of fin members in a plurality of groups so that respective fins of each fin member in each group are in registration with the fins of adjacent fin members in the group, and positioning the plurality of groups of fin members relative to each other so that respective fins of each fin member in each group are in registration with slots formed in groups adjacent thereto, thereby causing the adjacent groups of fin members to be reverse mirror images of each other.

15. The method of manufacturing, as recited in claim 6,
    wherein the fin members are joined in step (c) by joining the fin members to a common base plate.

16. The method of manufacturing, as recited in claim 6,
    wherein the plurality of fin members is a plurality of identical fin members.

* * * * *